(12) United States Patent
Jiang et al.

(10) Patent No.: US 6,402,903 B1
(45) Date of Patent: Jun. 11, 2002

(54) MAGNETIC ARRAY FOR SPUTTERING SYSTEM

(75) Inventors: Mingwei Jiang, Sunnyvale; Ken Lee, Mountain View; Gil Lavi, Sunnyvale, all of CA (US)

(73) Assignee: STEAG HamaTech AG, Sternenfels (DE)

( * ) Notice: Subject to any disclaimer, the term of this patent is extended or adjusted under 35 U.S.C. 154(b) by 0 days.

(21) Appl. No.: 09/499,092

(22) Filed: Feb. 4, 2000

(Under 37 CFR 1.47)

(51) Int. Cl.[7] .............................................. C23C 14/35
(52) U.S. Cl. .............................. 204/192.12; 204/298.2; 204/298.22
(58) Field of Search .................... 204/192.12, 298.2, 204/298.22

(56) References Cited

U.S. PATENT DOCUMENTS

| | | | |
|---|---|---|---|
| 4,312,731 A | 1/1982 | Morrison, Jr. | 204/192 R |
| 4,631,106 A | 12/1986 | Nakazato et al. | 156/345 |
| 4,746,417 A | 5/1988 | Ferenbach et al. | 204/298 |
| 4,872,964 A | 10/1989 | Suzuki et al. | 204/298 |
| 4,995,958 A | 2/1991 | Anderson et al. | 204/298.2 |
| 5,026,470 A | 6/1991 | Bonyhard et al. | 204/298.16 |
| 5,047,130 A | 9/1991 | Akao et al. | 204/192.12 |
| 5,126,029 A | 6/1992 | Tomer et al. | 204/192.12 |
| 5,130,005 A | 7/1992 | Hurwitt et al. | 204/192.12 |
| 5,164,063 A | 11/1992 | Braeuer et al. | 204/298.2 |
| 5,171,415 A | 12/1992 | Miller et al. | 204/298.09 |
| 5,182,003 A | 1/1993 | Maass et al. | 204/298.23 |
| 5,188,717 A | 2/1993 | Broadbent et al. | 204/192.12 |
| 5,194,131 A | 3/1993 | Anderson | 204/192.12 |
| 5,242,566 A | 9/1993 | Parker | 204/298.2 |
| 5,248,402 A | 9/1993 | Ballentine et al. | 204/298.2 |
| 5,252,194 A | 10/1993 | Demaray et al. | 204/298.2 |
| 5,284,564 A | 2/1994 | Maass | 204/298.2 |
| 5,314,597 A | 5/1994 | Harra | 204/192.13 |
| 5,320,728 A | 6/1994 | Tepman | 204/192.12 |
| 5,374,343 A | 12/1994 | Sasaki et al. | 204/298.2 |
| 5,409,590 A | 4/1995 | Hurwitt et al. | 204/298.2 |
| 5,417,833 A | 5/1995 | Harra et al. | 204/298.2 |
| 5,458,759 A | 10/1995 | Hosokawa et al. | 204/298.2 |
| 5,558,749 A | 9/1996 | Yokoyama et al. | 204/192.12 |
| 5,746,897 A | 5/1998 | Heimanson et al. | 204/298.2 |
| 5,753,092 A | 5/1998 | Hollars et al. | 204/298.26 |
| 5,795,451 A | 8/1998 | Tan et al. | 204/298.2 |

OTHER PUBLICATIONS

International Search Report, PCT/US01/02735, Jan. 26, 2001.

*Primary Examiner*—Steven H. VerSteeg
(74) *Attorney, Agent, or Firm*—Skjerven Morrill LLP; James E. Parsons

(57) ABSTRACT

A plasma sputtering system is disclosed, along with methods of sputtering and methods of arranging an array of magnets disposed within the sputtering system. An embodiment of the sputtering system includes a vacuum chamber. A rotating magnetron is disposed in the vacuum chamber. A target is positioned between the magnetron and a substrate upon which material from the target is to be deposited. The magnetron includes an array of pairs of oppositely poled permanent magnets. A closed loop magnetic path extends between the pairs of oppositely poled magnets of the array. The magnetic path includes an inturn region proximate to an axis of rotation of the magnetron and at least two (e.g., five) indent regions.

33 Claims, 3 Drawing Sheets

MAGNETIC ARRAY FOR SPUTTERING SYSTEM

CROSS-REFERENCE TO DISCLOSURE DOCUMENT

This application is related to Disclosure Document number S00949, entitled "Magnetic Circuit for Horizontal Sputtering Systems Containing Multiple Horizontal Lobes," which is dated Mar. 2, 1999.

FIELD OF THE INVENTION

The present invention concerns a plasma-based sputtering system that sputters material from a target onto a substrate, and in particular concerns the shape of an array of magnets of a magnetron of such a sputtering system.

BACKGROUND OF THE INVENTION

U.S. Pat. No. 5,248,402 (the "'402 patent") discloses a sputtering system magnetron that includes an array of permanent magnets rotated in proximity to a plane of a target disposed in a vacuum chamber. The shape of the array of magnets resembles a cross-section of an apple. A closed-loop magnetic path established between oppositely poled pairs of magnets of the array is inturned in a stem region proximate to the axis of rotation for the array and has a pair of opposed lobes extending outward from the stem region in a generally semi-circular form. The two lobes lead to and join each other in an indent region opposite the stem region. The maximum distance across the path between the two lobes is about double the minimum distance across the path between the stem region and the indent region.

SUMMARY OF THE INVENTION

The present invention includes a sputtering system and associated methods that provide unexpectedly superior deposition uniformity, target utilization, and target erosion uniformity compared to conventional sputtering systems. The superior results are obtained due to the provision of a magnetic path that includes an inturn region and at least two indent regions. By contrast, the magnetic path of the '402 patent included only one indent region.

An embodiment of the sputtering system includes a vacuum chamber. A rotating magnetron is disposed in the vacuum chamber. A target is positioned between the magnetron and a substrate upon which material from the target is to be deposited. The magnetron includes an array of pairs of oppositely poled permanent magnets. A closed loop magnetic path extends between the pairs of oppositely poled magnets of the array. The magnetic path includes an inturn region proximate to an axis of rotation of the magnetron and at least two (e.g., five) indent regions. As an example, the substrate may be an optical disk, although other types of substrates also may be used.

A method of sputtering using such a sputtering system includes applying electrical power across an inert gas (e.g., argon) in the vacuum chamber so as to form a plasma. Ions generated within the plasma bombard the target, causing material to be dislodged from the target and deposited on the substrate.

These and other aspects of the present invention may be understood by reference to the figures and the following detailed description of the exemplary embodiments.

BRIEF DESCRIPTION OF THE DRAWINGS

Similar items in the various drawings may be referred to by the same reference number.

DETAILED DESCRIPTION OF THE EXEMPLARY EMBODIMENTS

Figure 1:
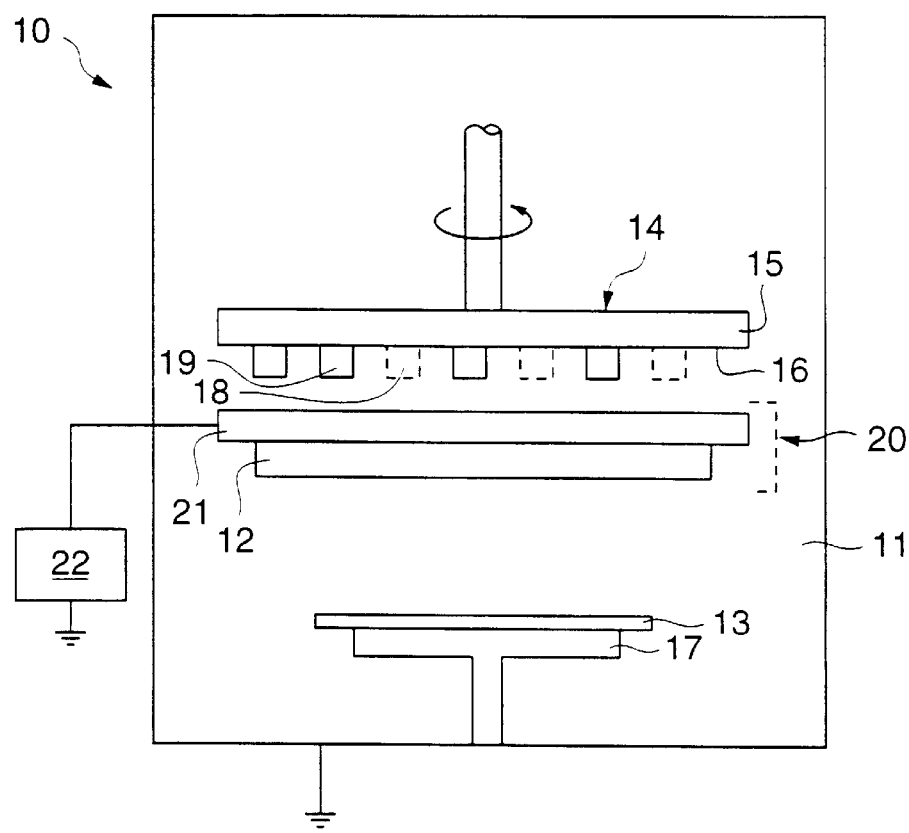
FIG. 1 is a schematic view of a sputter system 10.

FIG. 1 is a schematic view of a plasma-based sputtering system 10. Plasma-based sputtering processes are well known, and a variety of well-known configurations of sputtering systems (e.g., horizontal and vertical sputtering systems) may be used in accordance with the present invention.

Sputter system 10 sputters material from a target 12 onto an adjacent substrate 13. The sputtering of the target material onto substrate 13 occurs due to the creation of a plasma in vacuum chamber 11 of sputtering system 10. The plasma is created by the application of an electric field to a low pressure gas (e.g., argon) contained in vacuum chamber 11. The electric field ionizes the gas, and thereby creates ions and a "glow" that are characteristic of a plasma. The ions bombard target 12 with force. The ions dislodge material from target 12, and the dislodged material is deposited onto substrate 13.

The performance of the sputtering process is determined by a number of metrics, including the uniformity of the deposition across substrate 13, the uniformity of erosion of target 12, utilization of target 12, and the cleanliness of the deposition, among others.

Sputtering system 10 includes a rotatable magnetron 14 that is disposed in vacuum chamber 11. Magnetron 14 consists of a circular plate 15 having a lower first surface 16. An array 40 of oppositely poled pairs of permanent magnets 18 and 19 is on or adjacent to first surface 16. Conventional adhesives or fasteners may be used to secure the magnets. The magnets may be held in magnet-sized pockets in first surface 16, or in a cover plate thereon.

During a sputtering process, magnetron 14 is rotated.

Target 12 is part of a target assembly 20. In particular, target 12 is fixed to a side of a target backing plate 21 opposite magnetron 14. A cooling subassembly may be included in target assembly 20. Target 12 is circular. Typically, the diameter of target 12 will be less than or equal to the diameter of plate 21. For example, where an optical disk having a diameter of 120 mm is the substrate, plate 21 may have a diameter of 220 to 270 mm, and target 12 may have a diameter of 200 mm. Larger substrates generally require larger targets.

Substrate 13 is adjacent to target 12 on pedestal 17. A tubular shield may be installed between target 12 and substrate 13 for plasma confinement and gas distribution. The type of substrate 13 may vary, and thus the type of target materials may vary. For example, substrate 13 may be an optical disk, a metal disk for a computer hard drive, or a semiconductor wafer, among other possibilities. In an optical disk application, target 12 may be formed of silver, indium, tellurium, antimony, zinc sulfide, or silicon dioxide, among other possible materials. In a semiconductor wafer application, target 12 may be formed of tungsten or copper.

A plasma is created in vacuum chamber 11 by the application of electrical power to target assembly 20. Electrical power is provided by a power supply 22. Power supply 22 may include various types of power supplies, such as a radio frequency ("RF") power supply, a direct current ("DC") power supply, or a pulsed DC power supply. Alternatively, power supply 22 may include a combination of these types of power supplies for use in the alternative. Typically, an RF power supply or a pulsed DC power supply is used where target 12 is an insulative or dielectric material, and a DC power supply is used where target 12 is an electrically conductive material. The power applied may be in the range of 500 to 5000 watts, depending on the application. The pressure in vacuum chamber 11 may be in the range of 1 to 10 milliliter, but that also will vary with the application. Typically, vacuum chamber 11 is grounded.

Artisans will appreciate that sputtering system 10 may be a stand alone unit, or may be part of a multi-chamber system that includes a plurality of sputtering systems 10. The latter configuration is particularly appropriate for high throughput optical disk sputtering, where numerous different layers of materials are sequentially deposited on the optical disk substrate.

Figure 2:
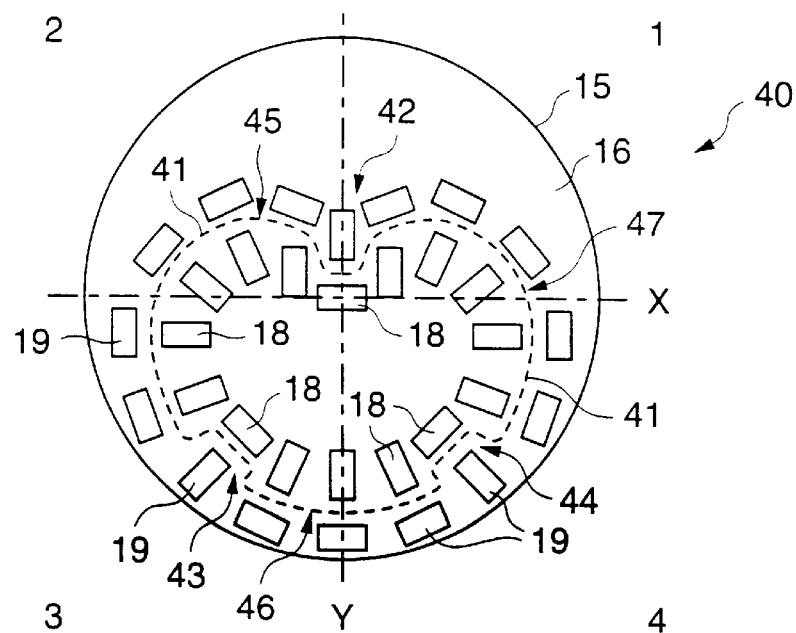
FIG. 2 is an plan view of a magnet array 40.

FIG. 2 is a top plan view of a magnet array 40 in accordance with one embodiment of the present invention. For convenience, X and Y axes are drawn with long dash and short dash lines through the axis of rotation of magnetron 14, and the resulting four quadrants are labeled 1, 2, 3, and 4.

Array 40 is disposed on first surface 16 of plate 15 of magnetron 14, facing target assembly 20. Although not shown, a counterweight also may be present on first surface 16 to achieve a balanced rotation. Array 40 is symmetrical about the Y axis.

Array 40 is formed of pairs of oppositely poled permanent magnets 18 and 19 that are arranged to straddle or lie on opposite sides of a symmetrical, closed loop magnetic path 41 that is shown by a dashed line. An inner magnet 18 of each pair of magnets is inside of magnetic path 41, and an outer magnet 19 of the respective pair is outside of magnetic path 41. Inner magnets 18 may have a north polarity, and outer magnets 19 may have a south polarity, or vice versa.

In one embodiment, magnets 18 and 19 of array 40 are oblong and have the form of a rectangular prism. The size, strength, and number of magnets 18 and 19, and the spacing between magnets 18 and 19 in array 40 (and in the alternative arrays described below), will vary depending on the application. As an example, where substrate 13 is an optical disk having a diameter of 120 mm, magnets 18 and 19 of array 40 may have length, width, and height dimensions of 17.0 mm×9.6 mm×19.2 mm, a spacing between magnets 18 and 19 of about half of the length of the magnets (about 8.5 mm), and a magnetic field strength of about 260 gauss. Artisans will appreciate, however, these parameters are variable depending on the application. One consideration is achieving a uniform magnetic field strength at target 12. Another consideration is the material of target 12.

A key inventive feature of array 40 (and of the alternative arrays discussed below) is the shape of the magnetic path of the array. Magnetic path 41 of array 40 departs significantly from the apple-shaped magnetic path shown in the '402 patent. As mentioned above, the apple-shaped magnetic path of the '402 patent includes a single indent region and two opposing lobes.

By contrast, array 40 and magnetic path 41 of FIG. 2 include an inturn region 42 proximate to the axis of rotation of plate 15, a first indent region 43, a second indent region 44, and three lobes 45, 46, and 47. Both indent regions 43 and 44 are below the X axis. Each lobe 45, 46, and 47 extends either between inturn region 42 and the adjacent indent regions 43 or 44, or between indent regions 43 and 44. In addition, magnetic path 41 is rounder than the magnetic path of the '402 patent as magnetic path 41 extends in its long dimension from one side of inturn region 42 to the other side of inturn region 42 (i.e., beginning in quadrant 2 of FIG. 2 and extending through quadrants 3, 4, and 1).

At the center of inturn region 42 and indent regions 43 and 44 is an oppositely poled magnet pair whose inner magnet 18 is tangentially arranged relative to magnetic path 41, and whose outer magnet 19 is radially arranged relative to magnetic path 41. Outside of inturn region 42 and indent regions 43 and 44, the inner magnet 18 of each pair is radially arranged relative to magnetic path 41, and the outer magnet 19 is tangentially arranged relative to magnetic path 41. In inturn region 42, where magnetic path 41 turns in rather sharply, the long side of the inner magnets 18 adjacent to the central magnet pair also may be somewhat tangential to magnetic path 41. In an alternative embodiment, the magnet pairs may be arranged so that the portion of magnetic path 41 opposite inturn region 42 and between indent regions 43 and 44 may be rectilinear (or close thereto) rather than arced.

The applicants have discovered that a magnet array, like array 40 and the alternative arrays disclosed below, having a magnetic path with two or more indent regions surprisingly achieves better results in terms of deposition uniformity, target utilization, and target erosion uniformity than an array with a single indent region, like that shown in the '402 patent.

Figure 3:
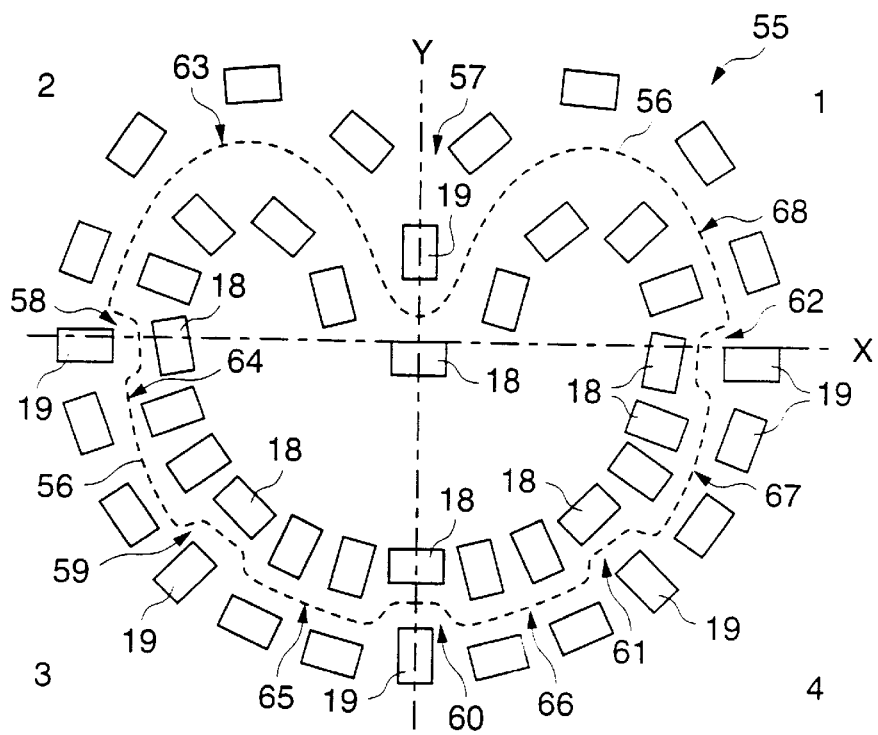
FIG. 3 is a plan view of a first alternative magnet array 55.

FIG. 3 is a top plan view of a magnet array 55 in accordance with another embodiment of the present invention. Array 55 may be used in sputter system 10 of FIG. 1 in place of array 40 of FIG. 2. In particular, array 55 is tailored for a RF power supply. Array 55 is symmetrical about the Y axis.

Array 55 is similar to array 40 of FIG. 2, in that array 55 includes pairs of oppositely poled magnets that straddle a symmetrical, closed loop magnetic path 56 that extends between the magnet pairs, and a plurality of indent regions. Differences between array 55 and array 40 include that array 55 has a greater number of magnet pairs 18 and 19, greater spacing between the magnet pairs in inturn region 57, and more magnet pairs in inturn region 57.

Array 55 and magnetic path 56 of FIG. 3 have an inturn region 57 proximate to the axis of rotation of plate 15, five indent regions 58–62, and six lobes 63–68. Each lobe 63–68 is either between inturn region 57 and an adjacent indent region, or between two adjacent indent regions. Compared to the magnet array of the '402 patent, array 55 of FIG. 3 has a greater number of indent regions (5 verses 1) and more and differently shaped lobes (6 verses 2). In addition, magnetic path 56 has a more round shape between the opposing sides of inturn region 57 than the magnetic path of the '402 patent.

As in array 40 of FIG. 2, the center of inturn region 57 and indent regions 58–62 of array 55 of FIG. 3 includes an oppositely poled magnet pair whose inner magnet 18 is tangentially arranged relative to magnetic path 56, and whose outer magnet 19 is radially arranged relative to magnetic path 56. Outside of inturn region 57 and indent regions 58–62, the inner magnet 18 of each pair is radially arranged relative to magnetic path 56, and the outer magnet 19 is tangentially arranged relative to magnetic path 56. In inturn region 57, where magnetic path 56 turns in rather sharply, the long side of the inner magnets 18 adjacent to the central magnet pair also may be somewhat tangential to magnetic path 56.

Figure 4:
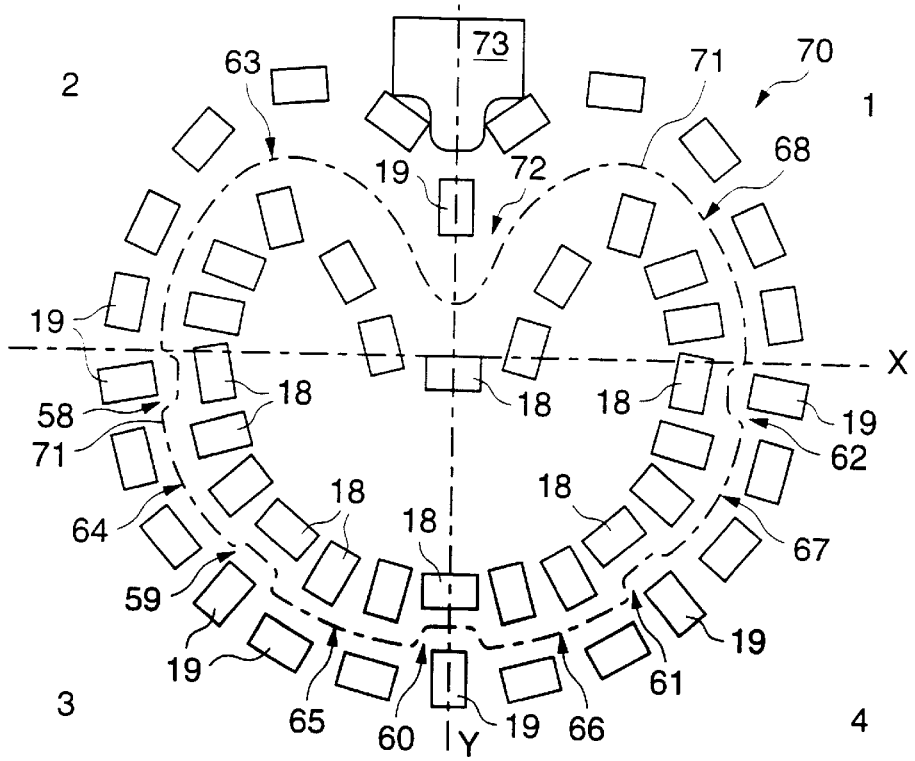
FIG. 4 is a plan view of a second alternative magnet array 70.

FIG. 4 is a top plan view of a magnet array 70 in accordance with another embodiment of the present invention. Array 70 also may be used in place of array 40 in sputter system 10. In particular, array 70 is tailored for a RF power supply. Array 70 is symmetrical about the Y axis. A counterweight 73 is positioned on the Y axis above the central magnetic pair of inturn region 72.

Array 70 is similar to array 55 of FIG. 3, in that array 70 includes pairs of oppositely poled magnets that straddle a closed loop magnetic path 71 that extends between the magnet pairs. Like array 55, array 70 of FIG. 5 also includes five indent regions 58–62 and six lobes 63–68. Differences between array 70 and array 55 include that, in array 70, there are two additional magnet pairs and greater spacing between the magnet pairs in inturn region 73, as compared to inturn region 57 of array 55. Again, the spacing between the magnets of the magnet pairs and the number of magnet pairs are variables that can be changed depending on the application.

As in array 55 of FIG. 3, the center of inturn region 72 and indent regions 58–62 of array 70 of FIG. 4 includes an oppositely poled magnet pair where the inner magnet 18 is tangentially arranged relative to magnetic path 71, and the outer magnet 19 is radially arranged relative to magnetic path 71. Outside of inturn region 72 and indent regions 58–62, the inner magnet 18 is radially arranged relative to magnetic path 71, and the outer magnet 19 is tangentially arranged relative to magnetic path 41. In inturn region 72, where magnetic path 71 turns in rather sharply, the long side of the inner magnets 18 adjacent to the central magnet pair also may be somewhat tangential to magnetic path 71. In an alternative embodiment, array rect 55 may be rectilinear (or close thereto), rather than arced, opposite inturn region 57 and between indent regions 59 and 61.

Figure 5:
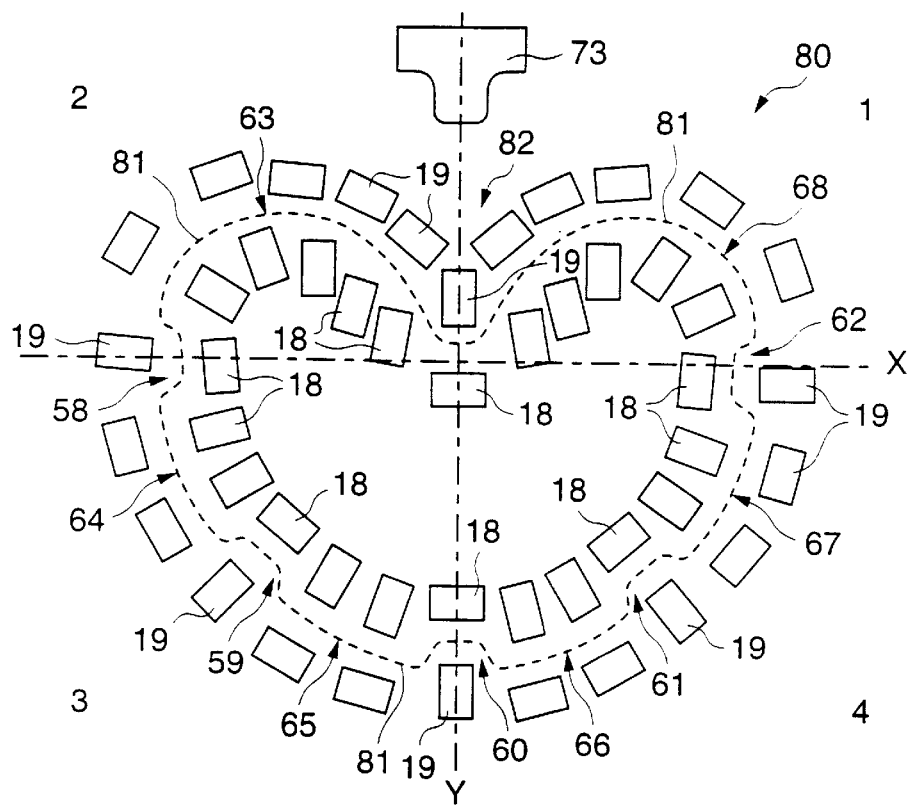
FIG. 5 is a plan view of a third alternative magnet array 80.

FIG. 5 is a top plan view of a magnet array 80 in accordance with another embodiment of the present invention. Array 80 also may be used in sputter system 10 of FIG. 1. In particular, array 80 is tailored for use with a RF power supply. Array 80 is symmetrical about the Y axis. A counterweight 73 is positioned on the Y axis above the central magnetic pair of inturn region 82.

Array 80 is similar to array 70 of FIG. 4, in that array 80 includes pairs of oppositely poled magnets that straddle a symmetrical, closed loop magnetic path 81 that extends between the magnet pairs. Array 80 and magnetic path 81 also include five indent regions 58–62 and six lobes 63–68. However, array 80 of FIG. 5 is less steeply sloped in its inturn region 82 and has closer spacing between the magnets of each pair in inturn region 82 than in inturn region 72 of array 70 of FIG. 4.

Figure 6:
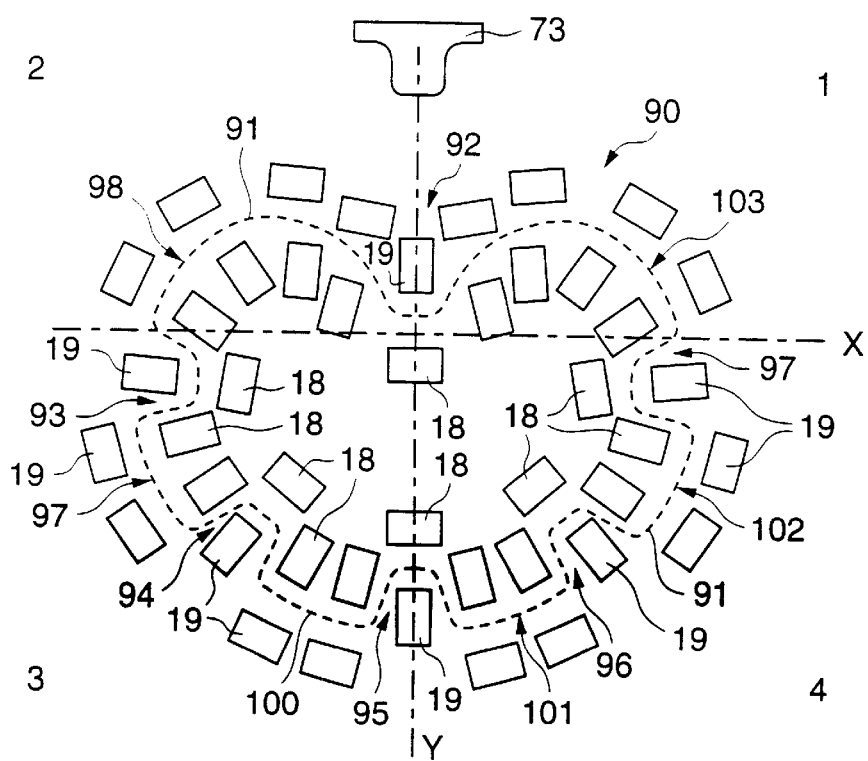
FIG. 6 is a plan view of a fourth alternative magnet array 90.

FIG. 6 is a top plan view of a magnet array 90 in accordance with another embodiment of the present invention. Array 90 also may be used in sputter system 10 of FIG. 1. In particular, array 90 is tailored for use with a DC power supply. Array 90 is symmetrical about the Y axis. A counterweight 73 is positioned on the Y axis above the central magnetic pair of inturn region 92.

Array 90 is similar to array 55 of FIG. 3, in that array 90 includes pairs of oppositely poled magnets that straddle a symmetrical, closed loop magnetic path 91 that extends between the magnet pairs. Array 90 and magnetic path 91 also include five indent regions 93–97 and six lobes 98–103. However, array 90 of FIG. 6 is more compact than array 55 of FIG. 3. Another difference is that, in array 90, each of the tangentially-arranged inner magnets at the center of indent regions 93–97 is inside of (i.e., closer to the axis of rotation than) the adjacent inner magnets 18. In addition, each radially-arranged outer magnets 19 at the center of indent regions 93–97 is inside of the adjacent outer magnets 19 of array 90.

The embodiments described herein achieve unexpectedly superior performance in comparison to the single indent design advocated in the '402 patent. Artisans will appreciate, however, that the present invention is not limited to the embodiments described herein, but rather is defined by the following claims.

We claim:

1. A method of arranging an array of opposing magnetic poles in a sputtering system, the method comprising:
   providing pairs of opposing magnetic poles;
   arranging the pairs in an array on a rotatable surface of the sputtering system so as to form a magnetic path extending between the opposing poles of each of the pairs, wherein said magnetic path includes an inturn region proximate to an axis of rotation of said rotatable surface and more than two indent regions.

2. The method of claim 1, comprising at least five said indent regions.

3. The method of claim 1, wherein said opposing magnetic poles comprise pairs of oppositely poled permanent magnets, and
   wherein said inturn region and said indent regions each include an inner magnet of a pair that is tangentially disposed to said magnetic path and an outer magnet of the pair that is radially disposed to said magnetic path.

4. A method of sputtering material onto a substrate, the method comprising:
   disposing said substrate in a chamber;
   rotating an array of opposite magnetic pole pairs, wherein said pairs are arranged so as to form a magnetic path extending between the opposing poles of each of the pairs, wherein said magnetic path includes an inturn region proximate to an axis of rotation of said array and more than two indent regions; and
   sputtering material onto the substrate.

5. The method of claim 4, comprising at least five said indent regions.

6. The method of claim 4, wherein said array of opposite magnetic pole pairs comprises pairs of oppositely poled permanent magnets, and
   wherein said inturn region and said indent regions each include an inner magnet of a pair that is tangentially disposed to said magnetic path and an outer magnet of the pair that is radially disposed to said magnetic path.

7. The method of claim 6, comprising at least five said indent regions.

8. The method of claim 4, wherein the pairs are arranged so that the magnetic path is approximately round between opposing sides of said inturn region.

9. The method of claim 4, wherein the pairs are arranged so that the magnetic path is approximately rectilinear opposite said inturn region.

10. The method of claim 4, wherein the substrate is an optical disk.

11. A magnetic path extending between pairs of opposite magnetic poles arranged on a rotatable surface in a sputtering system, said magnetic path comprising:
    an inturn region proximate to an axis of rotation of said surface and more than two indent regions.

12. The magnetic path of claim 11, comprising at least five said indent regions.

13. The magnetic path of claim 11, wherein said magnetic path is between pairs of oppositely poled permanent magnets, and wherein said inturn region and said indent regions each include an inner magnet of a pair that is tangentially disposed to said magnetic path and an outer magnet of the pair that is radially disposed to said magnetic path.

14. A sputtering system comprising:

a vacuum chamber; and a rotatable array of pairs of opposite magnetic poles within said vacuum chamber, wherein said pairs are arranged so as to form a closed loop magnetic path extending between the opposing poles of each of the pairs, wherein said magnetic path includes an inturn region proximate to an axis of rotation of said array and at least two indent regions, wherein said array comprises pairs of oppositely poled permanent magnets, and wherein said inturn region and said indent regions each include an inner magnet of a pair that is tangentially disposed to said magnetic path and an outer magnet of the pair that is radially disposed to said magnetic path.

15. A sputtering system comprising:

a vacuum chamber; and a rotatable array of pairs of opposite magnetic poles within said vacuum chamber, wherein said pairs are arranged so as to form a closed loop magnetic path extending between the opposing poles of each of the pairs, wherein said magnetic path includes an inturn region proximate to an axis of rotation of said array and more than two indent regions.

16. A method of sputtering material onto a substrate, the method comprising:

disposing said substrate in a plasma sputtering system;

rotating a magnet array of said sputtering system, said magnet array having a closed loop shape with an inturn region and at least two indent regions, wherein in relation to an axis of rotation of said magnet array, the inturn region is located on a first side of the axis of rotation, and the at least two indent regions are located on an opposite side of the axis of rotation; and sputtering material onto the substrate.

17. The method of claim 16, wherein a central one of said indent regions is located opposite the inturn region.

18. The method of claim 17, wherein second and third ones of said indent regions are symmetrically located on respective sides of the central indent region.

19. The method of claim 18, wherein said array further comprises an additional pair of indent regions.

20. The method of claim 19, wherein each indent region of said additional pair is on an imaginary line through the axis of rotation between the inturn region and the second and third indent regions.

21. The method of claim 16, wherein said magnet array includes only two said indent regions.

22. The method of claim 16, wherein said magnet array comprises more than two of said indent regions.

23. The method of claim 22, wherein said magnet array comprises five said indent regions.

24. A plasma sputtering system comprising:

a rotatable magnet array in a vacuum chamber of said plasma sputtering system, said magnet array having a closed loop shape with an inturn region and at least two indent regions, wherein in relation to an axis of rotation of said magnet array, the inturn region is located on a first side of the axis of rotation, and the at least two indent regions are located on an opposite side of the axis of rotation.

25. The plasma sputtering system of claim 24, wherein a central one of said indent regions is located opposite the inturn region.

26. The plasma sputtering system of claim 25, wherein second and third ones of said indent regions are symmetrically located on respective sides of the central indent region.

27. The plasma sputtering system of claim 26, wherein said magnet array further comprises an additional pair of indent regions.

28. The plasma sputtering system of claim 27, wherein each indent region of said additional pair is on an imaginary line through the axis of rotation between the inturn region and the second and third indent regions.

29. The plasma sputtering system of claim 24, wherein said magnet array comprises only two said indent regions.

30. The plasma sputtering system of claim 24, wherein said magnet array comprises more than two of said indent regions.

31. The plasma sputtering system of claim 30, wherein said magnet array comprises five said indent regions.

32. A method of sputtering a material onto a substrate comprising:

disposing the substrate in a vacuum chamber;

rotating a magnet array in said vacuum chamber, said magnet array having a generally apple shape with an inturn region and more than two indent regions; and sputtering the material onto the substrate using a plasma.

33. The method of claim 32, wherein said magnet array comprises five said indent regions.

* * * * *